United States Patent [19]

Yamamoto et al.

[11] Patent Number: 5,028,954

[45] Date of Patent: Jul. 2, 1991

[54] IMAGE RECORDING APPARATUS

[75] Inventors: Takemi Yamamoto; Shigeki Ishikawa; Masashi Ueda, all of Nagoya, Japan

[73] Assignee: Brother Kogyo Kabushiki Kaisha, Aichi, Japan

[21] Appl. No.: 568,737

[22] Filed: Aug. 17, 1990

[30] Foreign Application Priority Data

Aug. 17, 1989 [JP] Japan ................................ 1-96167[U]

[51] Int. Cl.[5] .............................................. G03B 27/52
[52] U.S. Cl. ......................................... 355/30; 355/27
[58] Field of Search ..................... 355/27, 30; 430/138; 354/301, 302, 299

[56] References Cited

U.S. PATENT DOCUMENTS

| 4,699,505 | 10/1987 | Komoriya et al. | 355/30 |
| 4,704,348 | 11/1987 | Koizumi et al. | 355/30 X |
| 4,786,947 | 11/1988 | Kosugi et al. | 355/30 |
| 4,853,743 | 8/1989 | Nagumo et al. | 355/30 X |
| 4,864,356 | 9/1989 | Asano et al. | 355/30 |
| 4,943,827 | 7/1990 | Good et al. | 355/30 |
| 4,945,383 | 7/1990 | Kobayashi et al. | 355/30 |
| 4,974,018 | 11/1990 | Komoriya et al. | 355/30 X |

Primary Examiner—Richard A. Wintercorn
Attorney, Agent, or Firm—Oliff & Berridge

[57] ABSTRACT

An image recording apparatus is provided which automatically controls the temperature and humidity in the region of a photosensitive recording medium. The recording medium carries the indication of its sensitivity characteristic. A detector disposed in the image recording apparatus reads the sensitivity characteristics which may take the form of the bar code or magnetic tape. The detector then sends an output signal, to a controller. At least one of a thermal sensor and a humidity sensor are provided in the passage of the photosensitive recording medium. These elements respectively sense the temperature and humidity and output their detection signals to the controller. The controller then controls a heater and a humidifier to set the optimal temperature and optimal humidity for the passage.

5 Claims, 2 Drawing Sheets

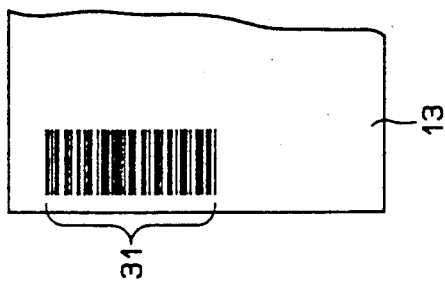
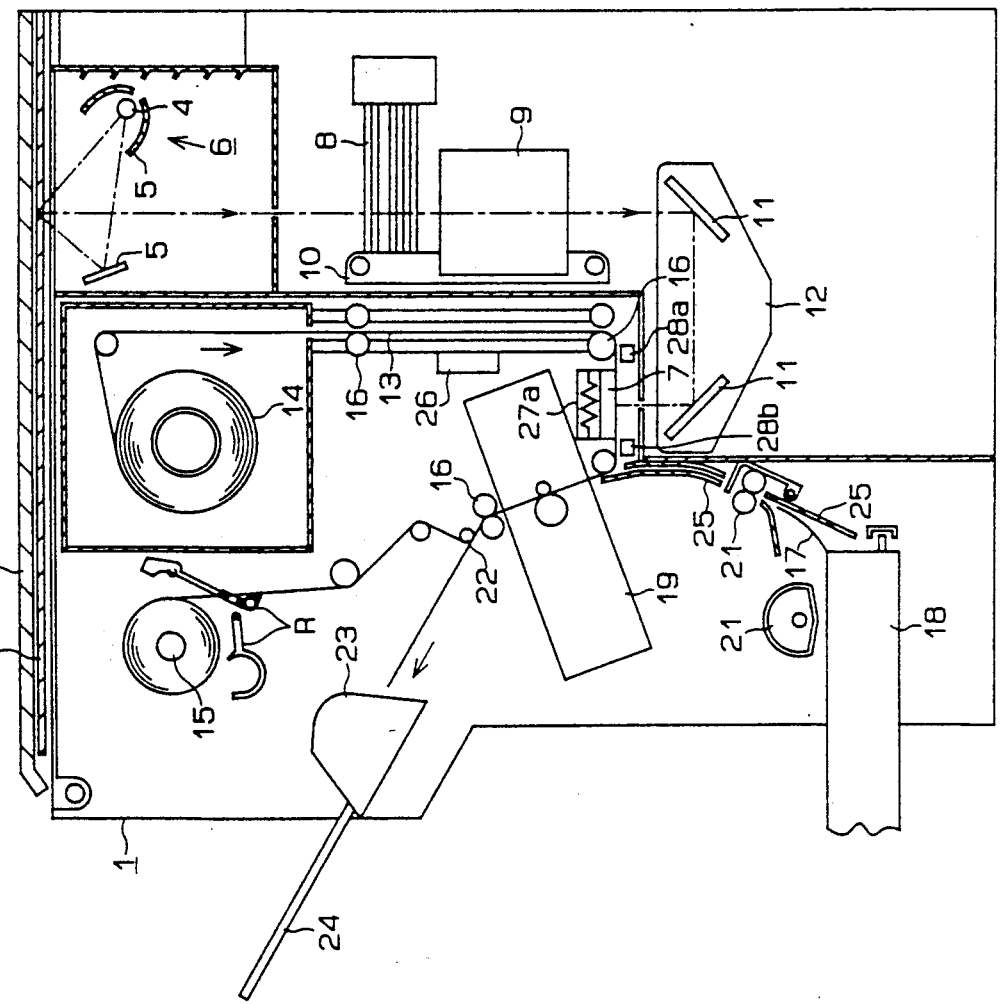

IMAGE RECORDING APPARATUS

This application claims the priority of Japanese Utility Model Application No. 1-96167 filed on Aug. 17, 1989, which is incorporated herein by reference.

BACKGROUND OF THE INVENTION

1. Field of the Invention

The present invention relates to an image recording apparatus. More particularly, the present invention is directed to an image recording apparatus utilizing environment sensitive which irradiates photosensitive recording medium.

2. Description of the Related Art

Conventional image recording machines, such as copying machines, irradiate a light on an original and project the light reflected from, or transmitted through, the original onto a photosensitive recording medium, thereby forming a latent image of the original on the recording medium.

It is known that the sensitivity of the photosensitive recording mediums used in such applications are often influenced by the temperature of the recording medium at the time of exposure. Improper ambient temperature around the photosensitive recording medium would therefore provide an image of a low quality and degrade the reproductibility of the image.

As a solution to this shortcoming, Asano et al. have disclosed proposed an image recording apparatus in U.S. Pat. No. 4,864,356 of which the present applicant is the assignee. This apparatus uses an elongated microcapsule paper as a photosensitive recording medium. The microcapsule paper is rolled within a recording paper accommodating case (paper cartridge) in the housing of the apparatus. In use, the microcapsule paper is fed out by the rotation of a motor-driven roller and is wound around a collection roller. The microcapsule paper fed out from the paper cartridge is exposed to alight when passing under a paper support located between the cartridge and the collection roller.

The desired ambient temperature to keep the optimal sensitivity of the microcapsule paper at the time of the exposure is stored in advance in a memory of a controller. Based on a signal from a sensor that detects the temperature of the passage of the microcapsule paper near the paper support, the controller controls a heater member disposed adjacent to the paper support to maintain the ambient temperature at the desired level, thus keeping the optimal sensitivity of the microcapsule paper.

Since the optimal ambient temperature is specifically set in advance in the above image recording apparatus, it is necessary for the user to input an optimal ambient temperature upon each replacement of the microcapsule paper with another having a different sensitivity characteristic. This job is troublesome.

SUMMARY OF THE INVENTION

It is therefore an object of the present invention to overcome the above-described shortcoming and to provide an image recording apparatus in which, when the photosensitive recording media is replaced with another having different sensitive characteristics, the temperature and/or humidity of the recording apparatus can be properly controlled so that the sensitivity of the recording medium can be maintained at a high level.

In relation with the above object, it is another object of the present invention to provide an image recording apparatus which eliminates the need to input the sensitivity characteristic of a photosensitive recording medium through a manual operation or the like and is thus easy to operate.

To achieve these objects in accordance with the present invention, an image recording apparatus is provided having means for forming an image on a photosensitive recording medium passing through a predetermined passage. The apparatus includes an indicator, provided on the photosensitive recording medium, for indicating a sensitivity characteristic thereof, a detector detectes the sensitivity characteristic indicated by the indicator and outputs an instruction signal indicative thereof, an adjusting device for adjusting at least one of environmental conditions that effect the sensitivity of the photosensitive recording medium in the passage. The detected environmental conditions may include either temperature or humidity, a sensor is provided in the passage for sensing its environmental condition. The sensor also outputs a detection signal indicative of the sensed condition, controller is adapted to receive the instruction and detection signals control the adjusting device in response thereto in order to provide an optimal environment for the photosensitive media.

In a preferred embodiment, both the temperature and humidity in a passage are properly controlled in accordance with the sensitivity characteristic of this photosensitive recording medium, thus maintaining the sensitivity at a high level. An image can therefore be formed on the photosensitive recording medium quickly and with high reproducibility.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings in which:

FIG. 2 is a side cross-sectional view showing the general structure of a copying machine;

FIG. 3 is a diagram illustrating a bar code on a microcapsule paper; and

DETAILED DESCRIPTION OF THE PREFERRED EMBODIMENTS

Figure 4:
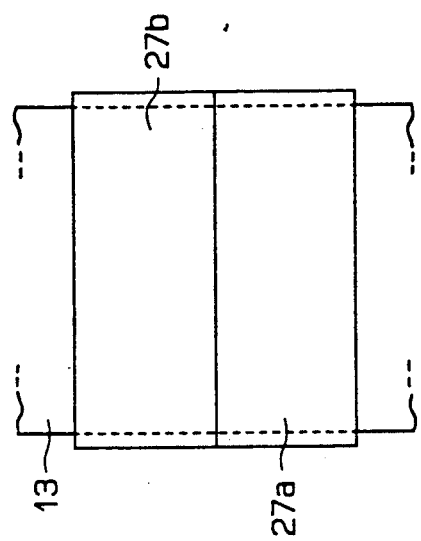
FIG. 4 is a plan view showing a heater and a humidifier located adjacent thereto.

A color copying machine according to one preferred embodiment of the present invention will now be described referring to the accompanying drawings.

As shown in FIG. 2, at the top of a housing 1 of the copying machine, a glass plate 2 on which an original is to be placed and a liftable cover 3 for covering the plate 2 are provided movable in the right and left directions.

In the housing 1, a halogen lamp 4 is disposed below the glass plate 2, extending in a direction perpendicular to the moving direction of the glass plate 2. The halogen lamp 4 irradiates light on the original placed on the glass plate 2. A plurality of mirrors 5 located adjacent to the halogen lamp 4 reflect the light from the lamp 4 toward the glass plate 2. The halogen lamp 4 and mirrors 5 constitute a light source 6. When the glass plate 2 is moved right and left during light emission of the light source 6, the light is irradiated on the entire original.

A paper guide 7 is disposed approximately at the center in the housing 1. Chromatic filters 8 for adjusting the color tone of a copied image and a condensing lens 9 are supported between the paper guide 7 and light source 6 by a support plate 10. A pair of mirrors 11 serving to focus the image and adjust the length of the optical path are supported between the lens 9 and paper guide 7 by a mounting plate 12 in such a manner that their positions can be adjusted. Therefore, the light reflected from the original is guided through the filters 8, lens 9 and mirrors 11 to the paper guide 7.

At the upper portion in the housing 1, a paper cartridge 14 is removable accommodated and a collection roller 15 is supported. Retained in the paper cartridge 14 retained a roll of an elongated microcapsule paper 13. The microcapsule paper acts as a photosensitive recording medium, and carries a number of microcapsule containing a color copying dye or the like, as disclosed in U.S. patent application Ser. No. 213,350. The free end of the microcapsule paper 13 has a bar code 31 affixed at one corner, as shown in FIG. 3, which represents the sensitivity characteristic of the specific microcapsule paper 13 used typically, this would vary based on the manufacturing lot.

A plurality of nip rollers 16 are disposed at different locations throughout the copying machine housing 1 to guide the microcapsule paper 13 as it travels from the paper cartridge 14 past the paper guide 7 to be wound around the collection roller 15. A paper loading member R as disclosed in Japanese Utility Model Application No. 1-95157 is disposed at the vicinity of the collection roller 15. This member R permits the end of the microcapsule paper 13 to be taken up around the collection roller 15, so that the collection roller 15 when driven can collect the microcapsule paper 13 therearound. At the time the microcapsule paper 13 is wound around the roller 15, the portion of the paper 13 which is passing through the paper guide 7 is exposed to a light so that the latent image of the original is formed thereon.

A bar-code reader 26 is provided on one side of the passage of the microcapsule paper 13 which connects the paper cartridge 14 with the paper guide 7. When the free end of the microcapsule paper 13 passes the bar-code reader 26, the bar-code reader 26 scans the bar code 31 to read information included therein.

A thermal sensor 28a located under the paper guide 7 measures the temperature of the passage for the microcapsule paper 13 in the neighborhood of the paper guide 7. A humidity sensor 28b provided adjacent to the thermal sensor 28a measures the humidity of the passage of the microcapsule paper 13 in the vicinity of the paper guide 7.

A heater 27a, mounted on the paper guide 7, heats this guide 7 to keep the temperature of the passage at a predetermined level. A humidifier 27b, disposed adjacent to the heater 27a (as shown in FIG. 4), humidifies the passage to maintain it at a predetermined humidity.

A paper cassette 18 retaining sheets 17 of developing paper is mounted removable below the paper guide 7. A transfer station 19 is disposed between the paper guide 7 and the collection roller 15. The sheet 17 is conveyed toward the transfer station 19 by a paper guide 25 and a plurality of nip rollers 21 provided between the paper cassette 18 and station 19 and paper guide 25. The exposed portion of microcapsule paper 13 and the sheet 17 are pressed together in the transfer station 19, so that a color image based on the latent image on the microcapsule paper 13 is formed on the sheet 17.

A separation roller 22, provided on the paper-feeding side of the transfer station 19, serves to separate the sheet 17 from the microcapsule paper 13 discharged from the station 19. A fusing station 23, disposed on the paper-feeding side of the separation roller 22, thermally fixes the imnage formed on the sheet 17. The sheet 17 is then collected on a paper tray 24.

Figure 1:
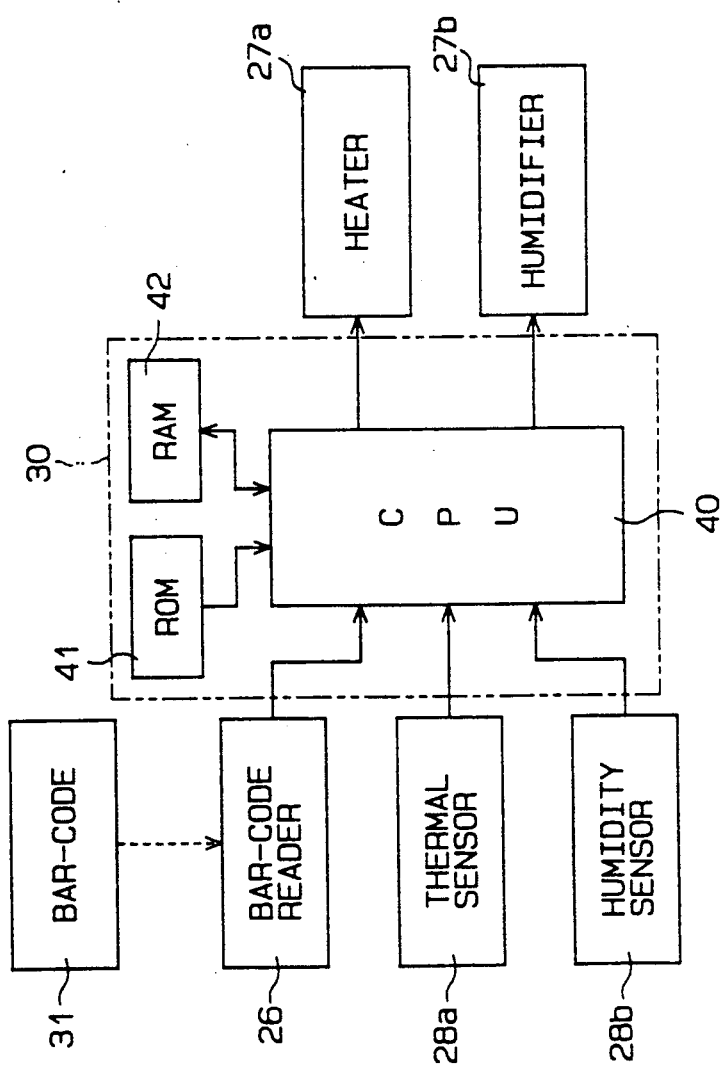
FIG. 1 is a block diagram illustrating a controller of an image recording apparatus embodying the present invention.

A description will now be given regarding a control circuit (shown in FIG. 1) that controls the image forming operation of the copying machine.

The bar-code reader 26 scans the bar code 31 on the microcapsule paper 13 and outputs a signal based on the sensitivity characteristic data included in the bar code 31, to a controller 30.

The thermal sensor 28a detects the temperature in the passage for the microcapsule paper 13, and outputs a detection signal to the controller 30. The humidity sensor 28b detects the humidity of the passage of the microcapsule paper 13, and outputs a detection signal to the controller 30.

The controller 30 has a central processing unit (CPU) 40, a read only memory (ROM) 41 and a random access memory (RAM) 42 built therein. Data correlating the required control output to the heater 27a based upon the detected temperature and data correlating the desired control output to the humidifier 27b based upon the detected humidity are stored in advance in the ROM 41 of the controller 30.

The controller 30 performs the necessary operation on the control outputs to keep the paper guide 7 at the optimal temperature and optimal humidity, based on the sensitivity characteristic inputted data from the bar-code reader 26, the temperature data inputted from the thermal sensor 28a and the humidity data inputted from the humidity sensor 28b. Based on the result of the operation, the controller 30 controls the heater 27a and humidifier 27b.

The copying machine described above is operated as follows.

The microcapsule paper 13 is fed inside the housing 1 from the paper cartridge 14 set within the housing 1. A group of the nip rollers 16 are driven to convey the microcapsule paper 13 toward the paper guide 7. When the free end of the microcapsule paper 13 passes along side of the bar-code reader 26, the reader 26 reads out the sensitivity characteristic data of the bar code 31 on the paper 13. This data is inputted to the controller 30 from the bar-code reader 26, to be stored in the RAM 42. Thereafter, the free end of the microcapsule paper 13 is wound around the collection roller 15 through the transfer station 19 and paper loading member R.

Upon driving of the nip rollers 16, the thermal sensor 28a measures the temperature of the passage near the paper guide 7 and outputs temperature data to the controller 30. The humidity sensor 28b measures the humidity of the passage and outputs humidity data to the controller 30.

The controller 30 periodically computes the difference between the optimal temperature and the optimal humidity of the paper passage based on the sensitivity characteristic data of the microcapsule paper 13 and the actual temperature and humidity data, and properly controls the heater 27a and humidifier 27b based on the result of the computation. As described above, the amount of heat generated by the heater 27a and the amount of humidity given by the humidifier 27b always undergo feedback control, so that the optimal temperature and humidity of the paper passage are maintained to provide the microcapsule paper 13 with the highest sensitivity.

A start button (not shown) is operated, after the microcapsule paper 13 is set and the paper guide 7 is controlled to have a predetermined temperature and the optimal humidity as descrived above. Consequently, the glass plate 2 moves to the right end of its movable range so that the left end of the original faces the halogen lamp 4 of the light source 6, and then the lamp 4 is turned on. When the glass plate 2 is moved back leftward in the above state and a light is irradiated on the entire surface of the original. The microcapsule paper 13 is conveyed on the paper support 7 toward the collecting side in synchronism with the return movement of the glass plate 2. As a result, the light reflected from the original passes through each chromatic filter 8. Therefore, the latent image of the original is formed on the microcapsule paper 13 on the paper support 7 by the reflected light.

Meanwhile, the sheet 17 is conveyed toward the transfer station 19 from the paper cassette 18 in synchronization with the leftward return movement of the glass plate 2. The exposed portion of the microcapsule paper 13 is pressed against the sheet 17 in the transfer station 19, thus forming a color image on the sheet 17. Then, the microcapsule paper 13 is separated from the sheet 17 by the separation roller 22 to be wound around the collection roller 15 with the assistance of loading device R. The sheet 17 is then guided into the fusing station 23 where the image is fixed by the internal heat, and is finally discharged on the paper tray 24.

Although only one embodiment of the present invention has been described herein, it should be apparent to those skilled in the art that the present invention may be embodied in many other specific forms without departing from the spirit or scope of the invention. Particularly, it should be understood that following modes may be applied.

As the indicating means for indicating the sensitivity characteristic of the microcapsule paper 13 and the detecting means for detecting the indication of the sensitivity characteristic, the bar code and bar-code reader may be replaced with punch holes and a photosensor. Alternatively a magnetic tape and a magnetic reader may be used. It should be appreciated that other conventional readers may be used as well. It is also contemplated that either the thermal sensor 28a or humidity sensor 28b alone may be provided in the passage of the microcapsule paper 13, and the heater 27a or humidifier 27b may be operated accordingly.

The thermal sensor, humidity sensor, heater and humidifier may be provided at the proximity of the transfer station 19 or fusing station 23. This arrangement can permit the photosensitive recording medium to have predetermined temperature and humidity so as to prevent the recording medium from stucking in the transfer station or fusing station. That is, it is possible to prevent the recording medium from being jammed.

Therefore, the present examples and embodiments are to be considered as illustrative and not restrictive and the invention is not to be limited to the details given herein, but may be modified within the scope of the appended claims.

What is claimed is:

1. An image recording apparatus including means for forming an image on a photosensitive recording medium passing through a predetermined passage, the apparatus comprising:
   indicating means, provided on the photosensitive recording medium, for indicating a sensitivity characteristic thereof;
   detecting means for detecting the sensitivity characteristic indicated by the indicating means and outputting an instruction signal;
   environmental adjusting means for adjusting an environmental condition that affect the sensitivity of the photosensitive recording medium in the passage;
   sensor means for sensing the environmental condition in the passage and outputting a detection signal; and
   control means for receiving the instruction and the detection signals, and controlling the adjusting means based on the sensitivity characteristics of the photosensitive recording medium and the environmental conditions in the passage.

2. The image recording apparatus as claimed in claim 1, wherein the environmental adjusting means includes at least one of a heater for adjusting a temperature of the passage and a humidifier for adjusting the humidity of the passage.

3. The image recording apparatus as claimed in claim 1, wherein the indicating means is a bar code.

4. The image recording apparatus as claimed in claim 3, wherein the detecting means is a bar-code reader for scanning the bar code.

5. An image recording apparatus including means for forming an image on a photosensitive recording medium passing through a predetermined passage, the apparatus comprising:
   a bar code, provided on the photosensitive recording medium, for indicating a sensitivity characteristic thereof;
   a bar-code reader for detecting the sensitivity characteristic indicated by the bar code and outputting an instruction signal;
   environmental adjusting means for adjusting an environmental condition, said environmental adjusting means being one selected from the group including a heater and a humidifier provided in the passage;
   sensor means for sensing the environmental condition and outputting a detection signal indicative thereof, said sensor being one selected from the group including a thermal sensor and humidity sensor;
   a memory for storing optimal operating data including one selected from the group including optimal temperature data and optimal humidity data indicative of the environmental conditions conducive to the highest sensitivity of the photosensitive recording medium in accordance with the sensitivity characteristic of the photosensitive recording medium; and
   a controller for reading the optimal operating data from the memory and the detection signal, and controlling the environmental adjusting means based on the read-out data and the detection signal.

* * * * *